(12) United States Patent
Cho et al.

(10) Patent No.: US 7,768,128 B2
(45) Date of Patent: Aug. 3, 2010

(54) SEMICONDUCTOR MEMORY DEVICES INCLUDING A DAMASCENE WIRING LINE

(75) Inventors: Young-woo Cho, Gyeongii-do (KR); Kyung-tae Lee, Seoul (KR); Heon-jong Shin, Gyeonggi-do (KR); Young-hwan Oh, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 693 days.

(21) Appl. No.: 11/499,059

(22) Filed: Aug. 4, 2006

(65) Prior Publication Data
US 2007/0035028 A1   Feb. 15, 2007

(30) Foreign Application Priority Data
Aug. 12, 2005   (KR) ...................... 10-2005-0074448

(51) Int. Cl.
H01L 23/48   (2006.01)
H01L 23/52   (2006.01)
H01L 29/40   (2006.01)

(52) U.S. Cl. ....................... 257/758; 257/369
(58) Field of Classification Search ................. 257/369, 257/758
See application file for complete search history.

(56) References Cited

U.S. PATENT DOCUMENTS 5,166,902 A * 11/1992 Silver .......................... 365/182
6,127,263 A   10/2000 Parikh ......................... 438/637
6,437,455 B2 *  8/2002 Mori et al. ................... 257/369
7,446,418 B2 * 11/2008 Watanabe .................... 257/758

FOREIGN PATENT DOCUMENTS

KR   1020020050469   12/2000
KR   1020040039593   5/2004

* cited by examiner

*Primary Examiner*—Howard Weiss
(74) *Attorney, Agent, or Firm*—Myers Bigel Sibley & Sajovec (57) ABSTRACT

Integrated circuit memory devices include an integrated circuit substrate and a plurality of lower wiring lines on the substrate and extending in a first direction. An interlayer insulating layer is on the plurality of lower wiring lines. An upper damascene wiring line is in an upper portion of the interlayer insulating layer and extending in a second direction, different from the first direction, to extend over the plurality of lower wiring lines. The upper damascene wiring line has protruded regions extending therefrom in a direction different from the second direction, the protruded regions extending over respective underlying ones of the lower wiring lines. A first via extends through the interlayer insulating layer under a first of the protruded regions and connects the upper damascene wiring line to a corresponding underlying first one of the plurality of wiring lines. A second via extends through the interlayer insulating layer under a second of the protruded regions and connects the upper damascene wiring line to a corresponding underlying second one of the plurality of wiring lines.

12 Claims, 11 Drawing Sheets

SEMICONDUCTOR MEMORY DEVICES INCLUDING A DAMASCENE WIRING LINE

CROSS-REFERENCE TO RELATED APPLICATION

This application is related to and claims priority under 35 U.S.C. §119 from Korean Patent Application No. 10-2005-0074448, filed on Aug. 12, 2005, in the Korean Intellectual Property Office, the disclosure of which is incorporated herein by reference in its entirety.

BACKGROUND OF THE INVENTION

The present invention relates to integrated circuit (semiconductor) memory devices and methods of fabricating the same, more particularly, to semiconductor memory devices which are capable of obtaining a process margin with improved electrical characteristics, and methods of fabricating the same.

For integrated circuit (semiconductor) devices requiring a high speed of operation, an associated design rule may be reduced. As the design rule is reduced, a RC delay effect on device performance may increase due to an increase of the resistance and the capacitance of a wiring line formed on the device. This increase RC delay may, in turn, lower the operating speed of the device.

In order to address the RC delay problem, it is know to use an interlayer insulating layer having a lower dielectric rate and wiring line materials having a lower resistance. For example, copper (Cu), rather than aluminum alloy, may be used as a wiring line material, as copper has lower specific resistance than the conventional aluminum alloy. In addition, copper typically has a smaller electrical migration than the conventional aluminum alloy.

However, when forming wiring lines using copper, as the etching characteristic of copper is generally very poor compared to aluminum, the wiring line is generally formed by a damascene process. A dual damascene process, which forms a via and a trench in the interlayer insulating layer and forms the wiring line by burying copper in the via and the trench has been used as a damascene process.

In the dual damascene process, when forming the via and the trench, a method of forming the trench after formation of the via may be used. However, in the course of forming the trench after formation of the via, a corner of the via may collapse, thereby generated a sloped region in the via. As a result, the lower wiring line may be exposed, which may cause the lower wiring line and an upper wiring line to be shorted.

SUMMARY OF THE INVENTION

Some embodiments of the present invention provide integrated circuit memory devices including an integrated circuit substrate and a plurality of lower wiring lines on the substrate and extending in a first direction. An interlayer insulating layer is on the plurality of lower wiring lines. An upper damascene wiring line is in an upper portion of the interlayer insulating layer and extends in a second direction, different from the first direction, over the plurality of lower wiring lines. The upper damascene wiring line has protruded regions extending therefrom in a direction different from the second direction, the protruded regions extending over respective underlying ones of the lower wiring lines. A first via extends through the interlayer insulating layer under a first of the protruded regions and connects the upper damascene wiring line to a corresponding underlying first one of the plurality of wiring lines. A second via extends through the interlayer insulating layer under a second of the protruded regions and connects the upper damascene wiring line to a corresponding underlying second one of the plurality of wiring lines. The first and second protruded regions may each extend in a same direction or may extend in opposite directions.

In other embodiments, the interlayer insulating layer is a first interlayer insulating layer and the device further includes a plurality of first active regions in the integrated circuit substrate and a plurality of second active regions in the integrated circuit substrate, the second active regions having a conductivity type different from a type of the first active regions. A first gate electrode on the integrated circuit substrate intersects a first one of the first active regions and a first one of the second active regions. A second gate electrode on the integrated circuit substrate intersects a second one of the first active regions and a second one of the second active regions. A second interlayer insulating layer is on the substrate in a region including the first and second gate electrode and extends over the first and second gate electrodes. The plurality of lower wiring lines and the first insulating layer are on the second insulating layer. A first via extends through the second interlayer insulating layer and connects the first one of the plurality of lower wiring lines to the first gate electrode. A second via extends through the second interlayer insulating layer and connects another one of the plurality of lower wiring lines to the second gate electrode.

In further embodiments, the another one of the plurality of lower wiring lines is a third one of the plurality of wiring lines, different from the second one of the plurality of wiring lines. The second one of the plurality of lower wiring lines may connect ones of the first active regions and the second active regions to each other. The first, second and third ones of the plurality of lower wiring lines may extend substantially parallel to one another. The first active regions and the second active regions may be divided into two parts, respectively. A third gate electrode may be provided that intersects the first and second ones of the first active regions. The device may be a CMOS memory device and the type of the first active regions may be one of n-type or p-type and the type of the second active regions may be the other of n-type or p-type.

In yet further embodiments, methods of fabricating an integrated circuit memory device are provided. Lower wiring lines are formed on an integrated circuit substrate extending in a first direction. An interlayer insulating layer is formed on the substrate including the lower wiring lines. A first via hole is formed that exposes a first of the lower wiring lines and a second via hole is formed that exposes a second of the lower wiring lines in the interlayer insulating layer by selectively etching the interlayer insulating layer. A trench is formed in an upper portion of the interlayer insulating layer, the trench extending in a second direction, different from the first direction, to extend over the lower wiring lines. The trench has protruded regions extending therefrom in a direction different from the second direction. The protruded regions extend over respective underlying ones of the lower wiring lines, ones of the protruded regions overlying and being connected on a bottom thereof to a corresponding underlying one of the first and second via holes. A conductive film is formed filling the via holes and the trench. A damascene wiring line is formed in the interlayer insulating layer by flattening the formed conductive film.

In other embodiments, the interlayer insulating layer is a first interlayer insulating layer and the method further includes forming a plurality of first active regions in the substrate and forming a plurality of second active regions in the substrate, the second active regions having a type different from a type of the first active regions. A first gate electrode is formed on the substrate that intersects a first one of the first active regions and a first one of the second active regions. A second gate electrode is formed on the substrate that intersects a second one of the first active regions and a second one of the second active regions. A second interlayer insulating layer is formed on the substrate in a region including the first and second gate electrode and extending over the first and second gate electrodes, wherein the lower wiring lines and the first insulating layer are on the second insulating layer. A first via is formed extending through the second interlayer insulating layer that connects one of the plurality of lower wiring lines to the first gate electrode and a second via is formed extending through the second interlayer insulating layer that connects another one of the plurality of lower wiring lines to the second gate electrode.

In yet other embodiments, the lower wiring lines include a first lower wiring line which is connected to the first gate electrode, a second lower wiring line through which the first active regions and the second active regions are connected to the second gate electrode, and a third lower wiring line through which the first active regions and the second active regions are connected to each other. The first lower wiring line through the third lower wiring line may extend substantially parallel to one another. The first lower wiring line and the third lower wiring line may be connected to each other by the damascene wiring line. The first active regions and the second active regions may be divided into two parts, respectively. A third gate electrode may be formed that intersects the first and second ones of the first active regions.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the Figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

A memory device according to some embodiments of the invention and a method of fabricating the same will now be described with reference to FIGS. 1 to 7. As shown in the embodiments of FIGS. 1 and 2, the memory device includes lower wiring lines 22, an interlayer insulating layer 24, and an upper damascene wiring line 46.

The illustrated lower wiring lines 22 are shown linearly extending in a first direction on a semiconductor substrate 10. The illustrated lower wiring lines 22 are shown extending substantially parallel to each other. The lower wiring lines 22 may be, for example, metal wiring lines. The lower wiring lines 22 may be, for example, copper.

Figure 1:
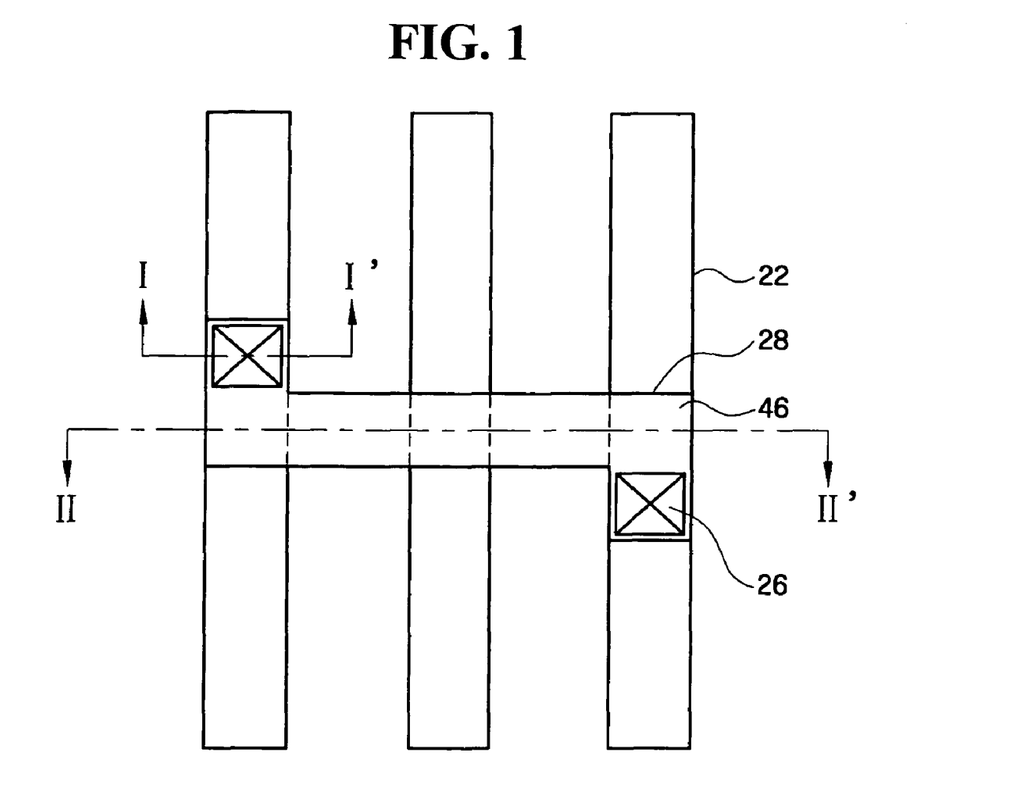
FIG. 1 is a layout view illustrating a memory device according to some embodiments of the invention.
Figure 2:
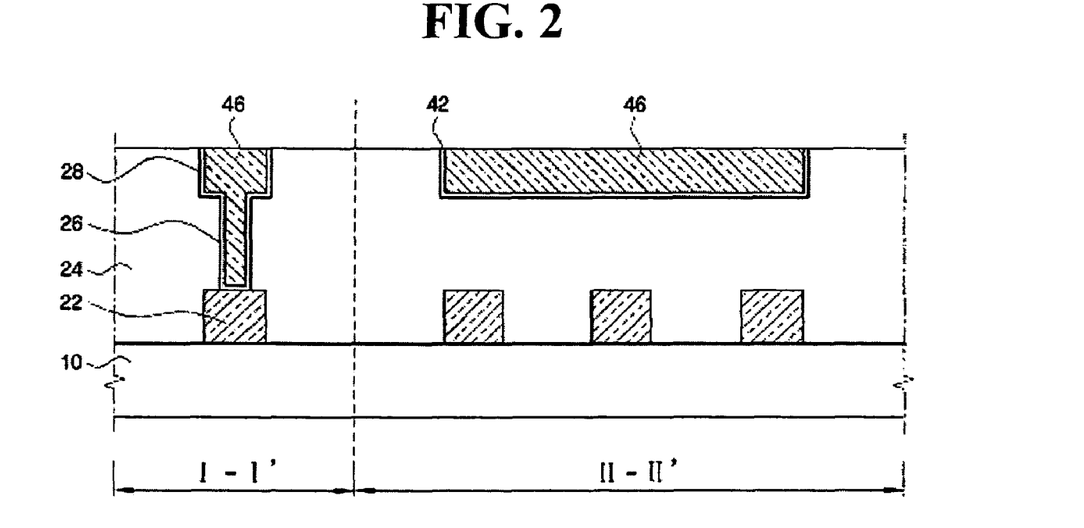
FIG. 2 is a cross-sectional view illustrating the memory device of FIG. 1 taken along the lines I-I' and II-II' of FIG. 1.

While not shown in FIGS. 1 and 2, it will be understood that semiconductor devices, such as transistors, may also be formed on the semiconductor substrate 10. The lower wiring lines 22 may be connected to such semiconductor devices.

The interlayer insulating layer 24 is provided on the semiconductor substrate 10 on which the lower wiring lines 22 are formed. The upper damascene wiring line 46 may be formed so as to be electrically connected to the lower wiring lines 22 by a via or the like extending through the interlayer insulating layer 24. The interlayer insulating layer 24 may be a silicon oxide film, such as PSG (PhosphoSilicate Glass), BPSG (BoroPhosphoSilicate Glass), USG (Undoped Silicate Glass), and PE-TEOS (Plasma Enhanced-TetraEthylOrthoSilicate) and/or a low dielectric film on which fluorine, carbon and/or the like is doped.

The upper damascene wiring line 46 formed in the interlayer insulating layer 24 is vertically displaced from the lower wiring lines 22 and extends over the lower wiring lines 22 in a second direction. In addition, the upper damascene wiring line 46 includes a region that protrudes laterally (relative to the second direction) from a portion of the upper damascene wiring line 46 over the lower wiring lines 22. The via 26 formed under the protruded region connects to the underlying lower wiring line 22. More particularly, as seen in FIG. 1, a protruded region is provided on each end of the upper damascene wiring line 46 and the respective lower wiring lines 22 under the protruded regions are electrically connected to each other by the upper damascene wiring line 46 and respective vias 26. The protruded regions at the ends of the upper damascene wiring line 46 may protrude in the same direction or in opposite directions to each other as seen in FIG. 1.

In some embodiments, the upper damascene wiring line 46 is a metal wiring line made of a metal material such as copper, and a diffusion barrier film 42 is formed between the upper damascene wiring line 46 and the interlayer insulating layer 24, which may limit or even prevent diffusion of the metal material of the upper damascene wiring line 46. It will be understood that a seed layer may be interposed between the diffusion barrier film 42 and the upper damascene wiring line 46.

Figure 3:
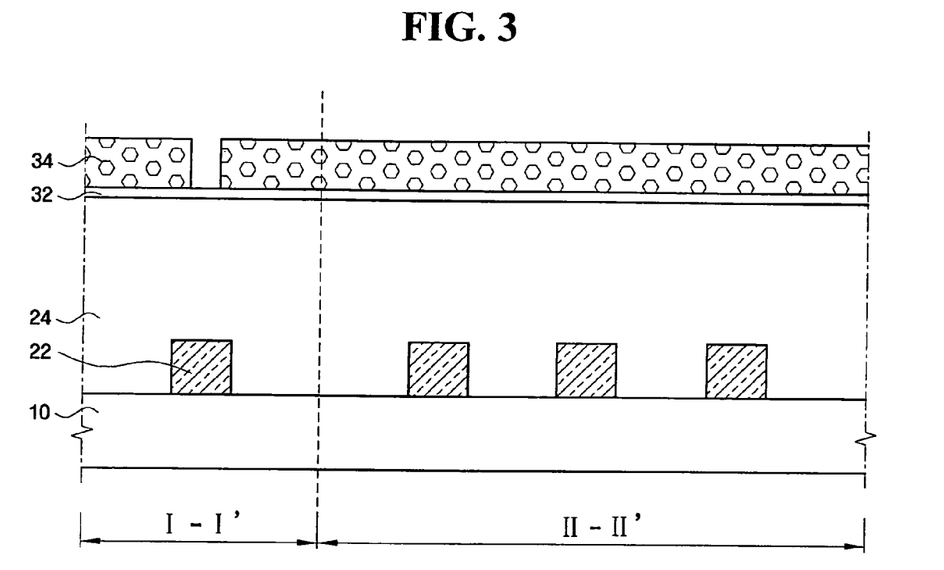
FIGS. 3 to 7 are cross-sectional views illustrating methods of fabricating a memory device according to some embodiments of the present invention.

A method of fabricating (forming) an integrated circuit (semiconductor) memory device according to some embodiments of the present invention will now be described with reference to FIGS. 3 to 7. As shown in the embodiments of FIG. 3, the lower wiring lines 22 are formed on the semiconductor substrate 10 extending in a first direction. The lower wiring lines 22 may be formed, for example, using a photolithography process after deposition of the metal material used in forming the lower wiring lines 22.

Also shown in FIG. 3 are the interlayer insulating layer 24 and a first antireflective film 32 sequentially formed on an upper surface of the substrate 10 in a region including the lower wiring lines 22. The interlayer insulating layer 24 may be, for example, a silicon oxide film, such as PSG (PhosphoSilicate Glass), BPSG (BoroPhosphoSilicate Glass), USG (Undoped Silicate Glass), and/or PE-TEOS (Plasma Enhanced-TetraEthylOrthoSilicate) and/or a low dielectric film doped with fluorine and/or carbon. An organic material may be used to form the first antireflective film 32.

A first photoresist pattern 34 is also shown in FIG. 3 formed on the first antireflective film 32. The first photoresist pattern illustrated in FIG. 3 is patterned to allow formation of a via hole through which the lower wiring lines 22 may be exposed.

Figure 4:
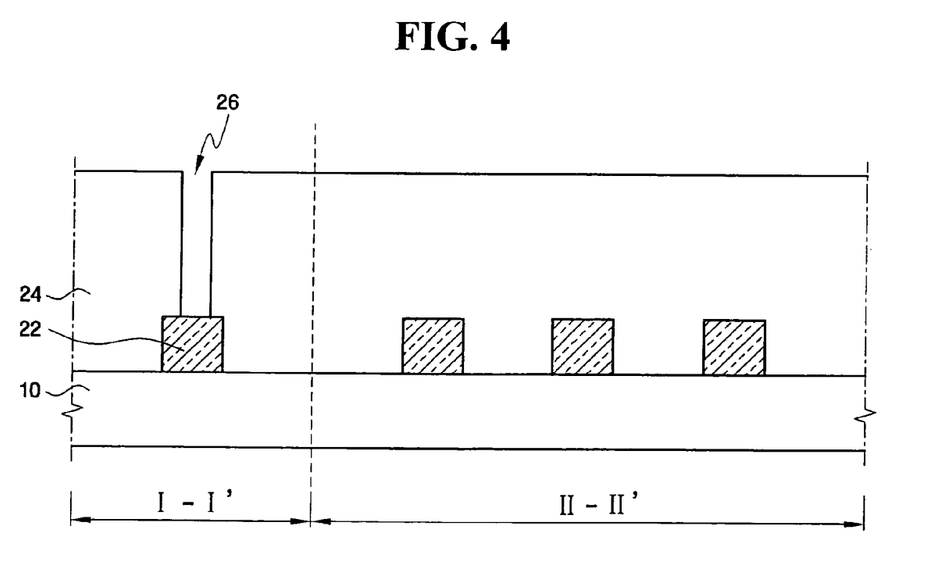

Referring now to FIG. 4, the first antireflective film 32 and the interlayer insulating layer 24 are shown after being sequentially etched using the first photoresist pattern 34 as an etching mask. As a result, the via hole 26 is formed to expose an underlying one of the lower wiring lines 22. As also shown in FIG. 4, after the via hole 26 is formed, the first antireflective film 32 and the first photoresist pattern 34 remaining on the interlayer insulating layer 24 are removed.

Figure 5:
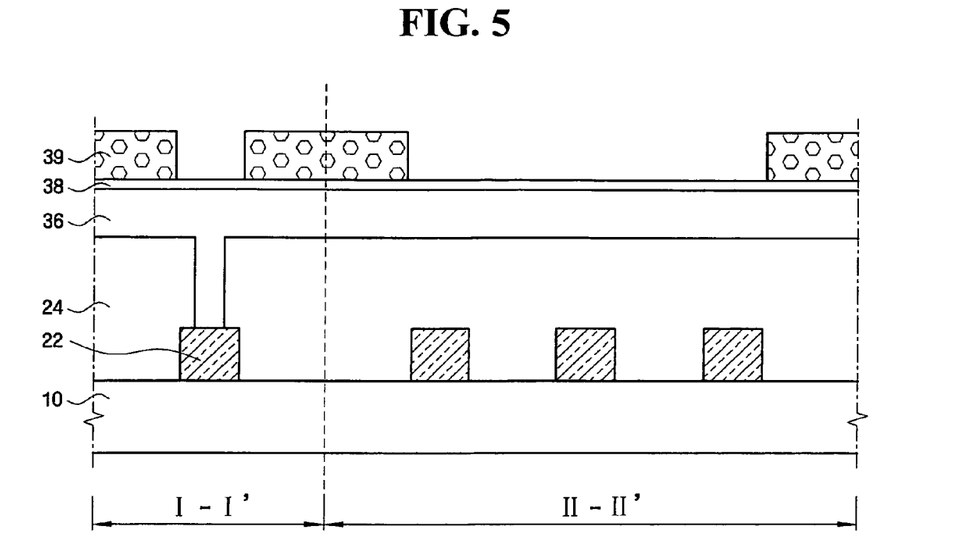

Referring now to FIG. 5, a sacrificial film 36 is shown formed on the interlayer insulating layer 24, which sacrificial film 36 fills the via hole 26. The sacrificial film 36 may be dry etched at a dry etching rate similar to that of the interlayer insulating layer 24, and formed of a SOD (Spin On Deposition) film having high wet etching selectivity with respect to a low dielectric film of the interlayer insulating layer 24. As a SOD film typically has excellent via hole burying and flattening characteristics, a SOD film may be benefically selected as a burying material or a flattening material. An HSQ (Hydrogen Silses Quioxane) film, a MSQ (Methyl Silses Quioxane) film and/or a SOP (Spin On Polymer) film may be used as the SOD film in some embodiments.

As also shown in FIG. 5, a second antireflective film 38, which may be an organic material, is formed on the sacrificial film 36. Furthermore, a second photoresist pattern 39 is formed on the second antireflective film 38. The second photoresist pattern 39 is patterned for use in forming a trench 28 (FIG. 6).

Figure 6:
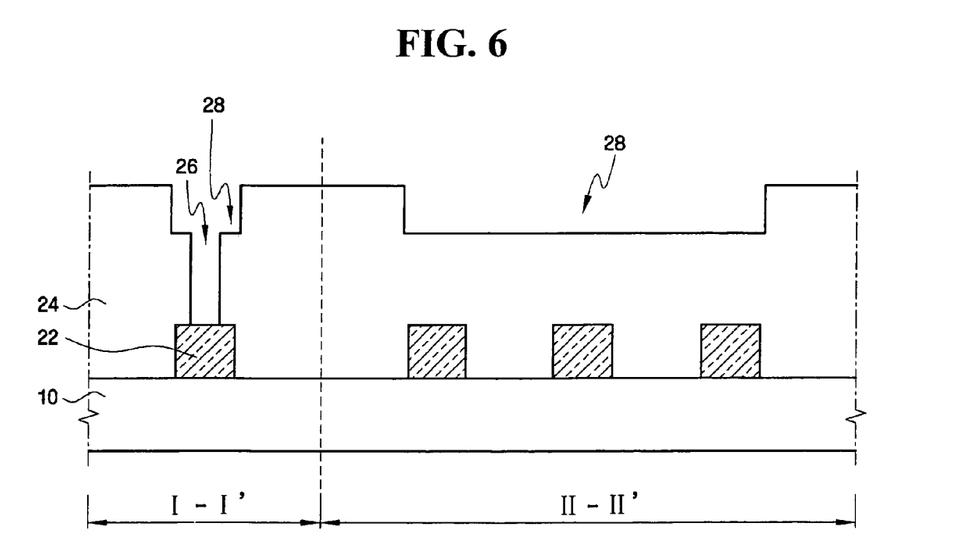

As seen in FIG. 6, the second antireflective film 38, the sacrificial film 36, and the interlayer insulating layer 24 may be sequentially etched using the second photoresist pattern 39 as an etching mask. The sacrificial film 36 and the interlayer insulating layer 24 may be etched regardless of etching selectivity. As a result, the trench 28 is formed in the interlayer insulating layer 24 with a portion thereof connected to the via hole 26 therebeneath.

The trench 28 is also formed in portions of the interlayer insulating layer 24 not overlapped with (overlying) the via hole 26. The non-overlying portion of the trench 28 in the illustrated embodiments is vertically displaced from the lower wiring lines 22 and extends in a second direction, crossing the first direction in which the lower wiring lines 22 extend. A laterally extending region of the trench 28 extends over one of the lower wiring lines 22 to protrude laterally toward the via hole 26. Such a protruding region may be provided on each end of the trench 28, which protruding regions may protrude in the same direction or in different or opposite directions. The protruded region(s) of the trench 28 are connected to corresponding underlying via hole(s) 26.

In some embodiments, a width of the trench 28 in the protruded region connected to the via hole 26 may be substantially the same as a width of the underlying one of the lower wiring lines 22. As a result, during the etching process used in forming the trench 28, the phenomenon in which a corner of the via hole 26 formed at the lower portion collapses in the direction of the lower wiring lines 22 positioned on one side may be limited or even prevented.

As shown in FIG. 6, the second photoresist pattern 39 and the second antireflective film 38 are removed. In addition, the sacrificial film 36 remaining on the upper portion of the interlayer insulating layer 24 and within the via hole 26 is removed. As such, the trench 28 is positioned in the direction vertical to the lower wiring lines 22 so as to protrude laterally from the lower wiring lines 22 and the via hole 26 connected to the lower portion of the protruded trench 28 are formed in the interlayer insulating layer 24.

Figure 7:
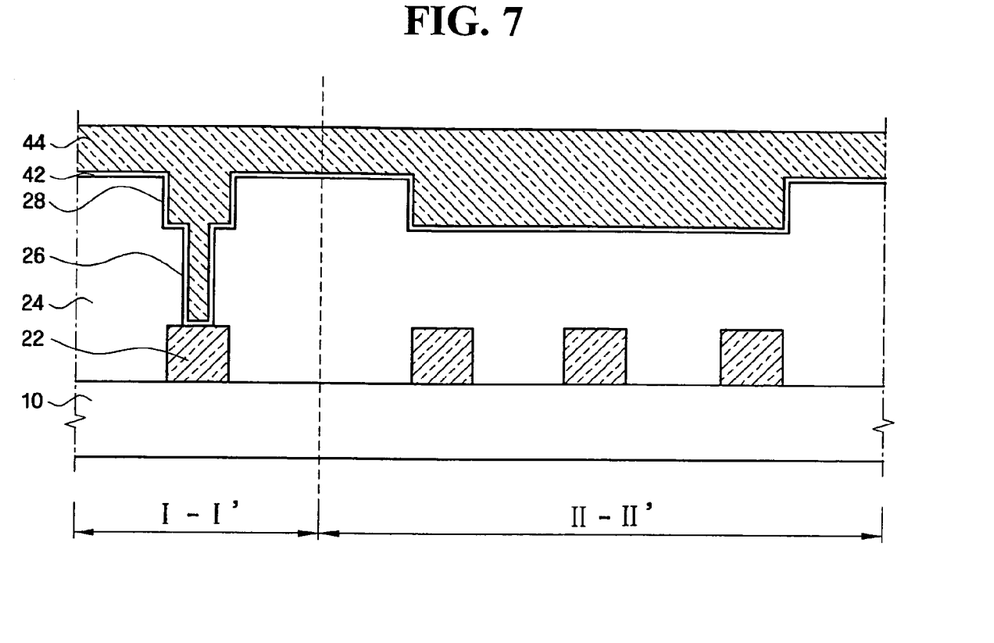

Referring now to FIG. 7, a diffusion barrier film 42 and a seed layer may be deposited conformally along the trench 28 and the via hole 26. The diffusion barrier film 42 may be formed, for example, of Ta, TaN, TaSiN, Ti, TiN, TiSiN, W and/or WN. The seed layer may be a copper film that may be deposited by a CVD process and/or a PVD process.

A conductive film 44 is formed in the trench 28 and the via hole 26. The conductive film 44 may be formed, for example, by electro plating and/or electroless plating. The formed conductive film 44 may be thick enough to bury the trench 28 and the via hole 26 as shown in FIG. 7. The conductive film 44 may be made of various conductive materials and/or combinations thereof. In some embodiments, the conductive film 44 includes copper (Cu). Referring now to FIG. 2, the upper damascene wiring line 46 may be formed by performing a CMP process on the conductive film 44 until the second interlayer insulating film 24 is exposed.

An integrated circuit (semiconductor) memory device according to other embodiments of the present invention and a method of fabricating (forming) the same will now be described with reference to FIGS. 8 to 16. The embodiments illustrated in FIGS. 8 to 16 may be used as a SRAM device.

Figure 8:
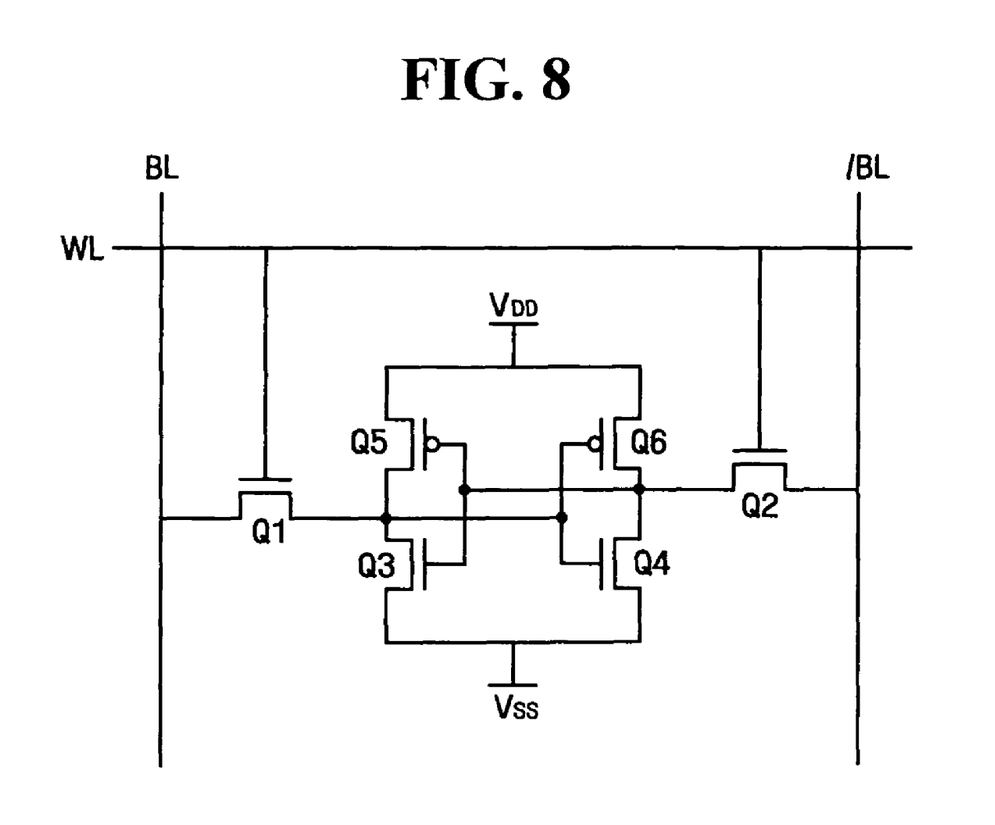
FIG. 8 is a circuit diagram illustrating a memory device according to further embodiments of the present invention.

FIG. 8 is a circuit diagram illustrating a cell of an integrated circuit memory device according to some embodiments of the present invention. As shown in FIG. 8, the memory device is a CMOS SRAM device. The cell of the memory device includes first and second access transistors Q1, Q2, first and second actuating transistors Q3, Q4, and first and second load transistors Q5, Q6.

The sources of the first and second actuating transistors Q3, Q4 are connected to a ground line $V_{SS}$, and the sources of the first and second load transistors Q5, Q6 are connected to a power line $V_{DD}$.

The first actuating transistor Q3, shown as an NMOS transistor, and the first load transistor Q5, shown as a PMOS transistor, provide a first inverter. The second actuating transistor Q4, shown as a NMOS transistor, and the second load transistor Q6, shown as a PMOS transistor, provide a second inverter.

Output stages of the first and second inverters are connected to sources of the first access transistor Q1 and the second access transistor Q2, respectively. Furthermore, input stages and output stages of the first and second inverters are alternately connected so as to constitute a latch circuit. drains of the first and second access transistors Q1, Q2 are connected to first and second bit lines BL, /BL, respectively.

Figure 9:
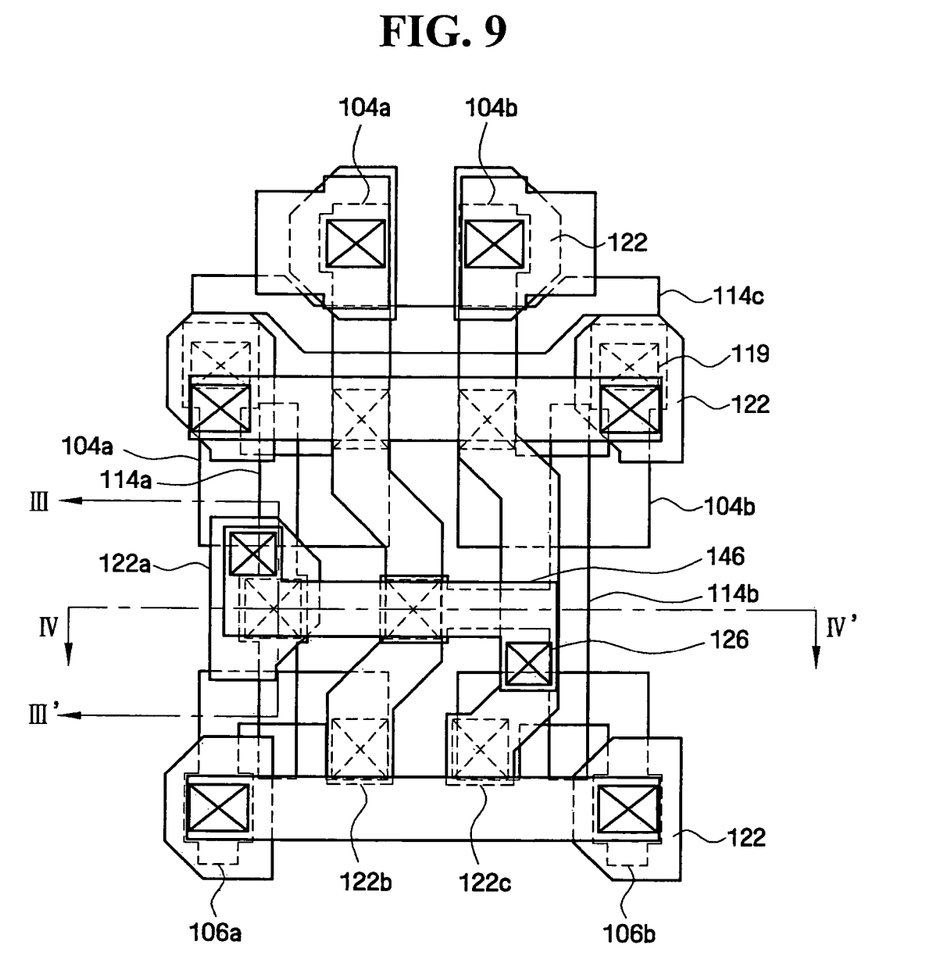
FIG. 9 is a layout view illustrating a memory device according to other embodiments of the present invention.
Figure 10:
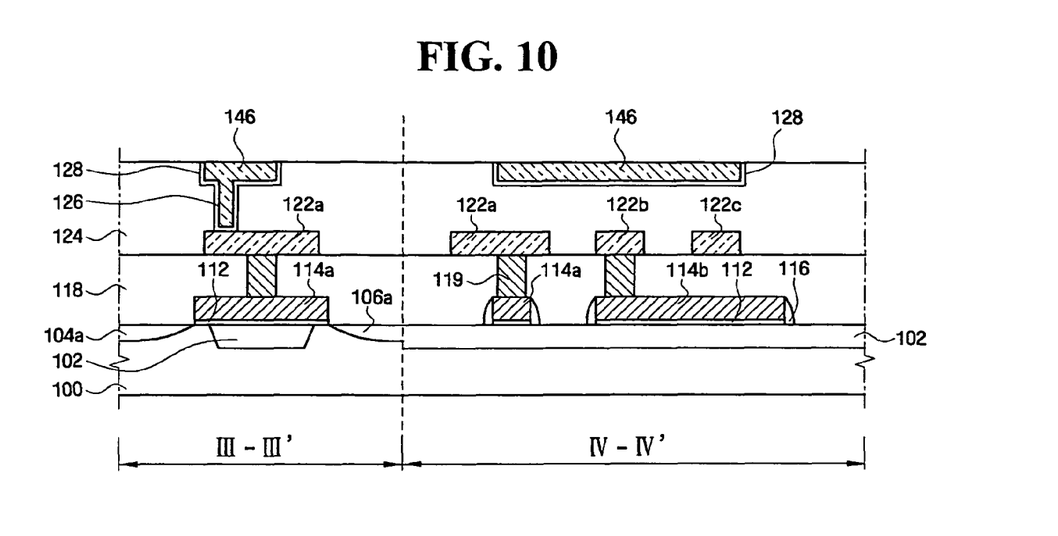
FIG. 10 is a cross-sectional view illustrating the memory device of FIG. 9 taken along the lines III-III' and IV-IV' of FIG. 9.

FIG. 9 is a layout view illustrating a memory device according to other embodiments of the invention. FIG. 10 is a cross sectional view illustrating the memory device of FIG. 9 taken along the lines III-III' and IV-IV' of FIG. 9.

Figure 11:
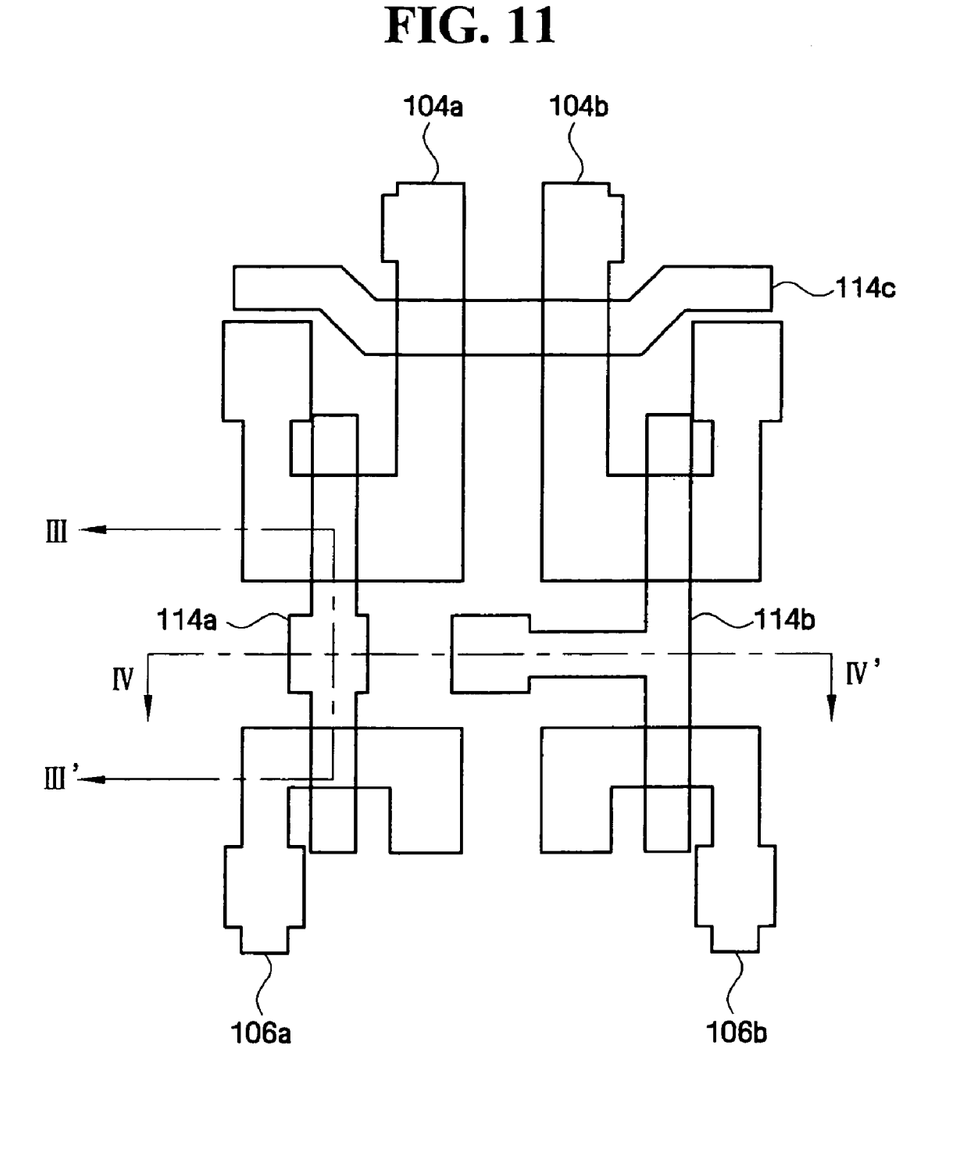
FIGS. 11 to 17 are layout and cross-sectional views illustrating methods of fabricating a memory device according to further embodiments of the present invention.

As shown in FIGS. 9 through 11, in a semiconductor substrate 100, first and second active regions 104a, 104b, 106a, 106b are defined by device isolation layer patterns 102. The illustrated first active regions 104a and 104b correspond to an n-type impurity region and the second active regions 106a and 106b correspond to a p-type impurity region. As best seen in FIG. 11, the first and second active regions 104a, 104b, 106a, 106b are illustrated as symmetrical in the cell, and each of the first and second active regions 104a, 104b, 106a, 106b is divided into two regions by the device isolation layer patterns 102.

First and second gate electrodes 114a, 114b intersect the first and second active regions 104a, 104b, 106a, 106b on the semiconductor substrate 100 in which the first and second active regions 104a, 104b, 106a, 106b are defined by the device isolation layer patterns 102. Furthermore, a third gate electrode 114c intersects the first active regions 104a, 104b, which are divided into two parts, and extends in a direction substantially orthogonal to the first and second gate electrodes 114a and 114b. The first or second gate electrode 114a and 114b may protrude toward the other gate electrodes on the device isolation layer patterns 102 between the first and second active regions 104a, 104b, 106a, and 106b. Additionally, gate oxide films 112 are provided under the first to third gate electrodes 114a, 114b, and 114c and gate spacers 116 are provided at both ends of the first to third gate electrodes.

The first and second gate electrodes 114a and 114b, on an end thereof extending over the first active regions 104a and 104b, form gates of the third and fourth actuating transistors (see Q3 and Q4 of FIG. 8), and the first and second gate electrodes 114a and 114b, on an end thereof extending over the second active regions 106a and 106b, form gates of the fifth and sixth load transistors (see Q5 and Q6 of FIG. 8). Furthermore, the third gate electrode 114c, which intersects the first active regions 104a and 104b, forms gates of the first and second access transistors (see Q1 and Q2 of FIG. 8).

As seen in FIG. 10, first interlayer insulating layer 118 is provided on the semiconductor substrate 100 on which the gate electrodes 114a, 114b, and 114c are formed. Contacts 119 extend through the first interlayer insulating layer 118 to connect to the gate electrodes 114a, 114b, and 114c. Additionally, lower wiring lines 122, which are connected to the contacts 119, are formed on an upper portion/surface of the first interlayer insulating layer 118.

Figure 13:
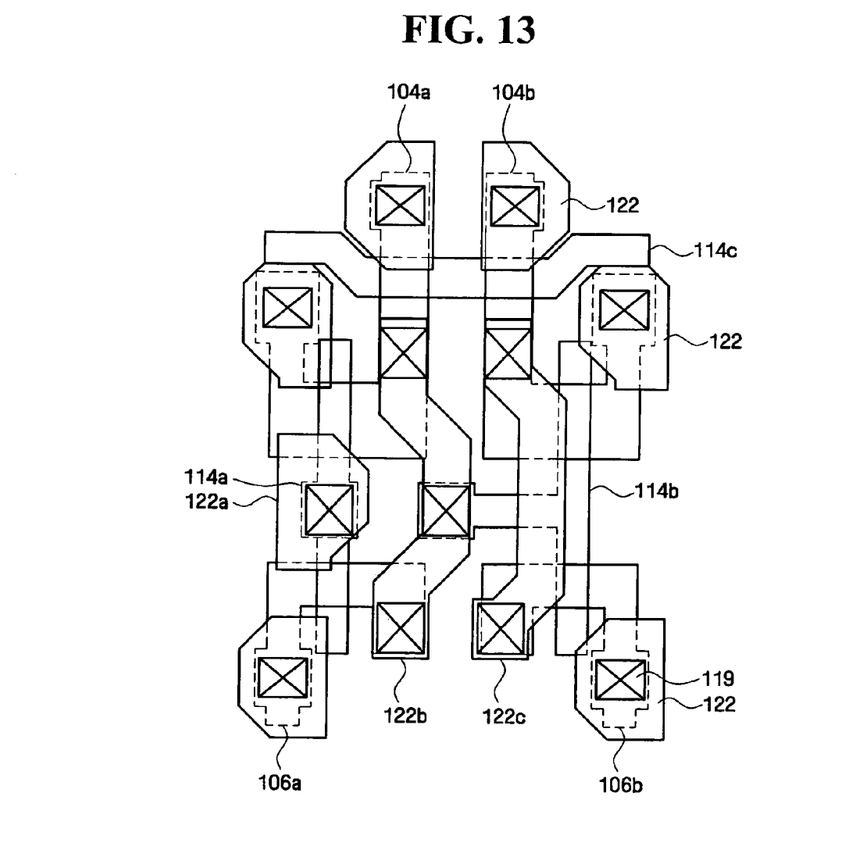

As shown in FIGS. 9, 10 and 13, the lower wiring lines 122 include a first lower wiring line 122a connected to the first gate electrode 114a, a second lower wiring line 122b connected to the second gate electrode 114b and extending over the active regions 104a, 106a, and a third lower wiring line 122c extending over the active regions 104b, 106b. The first to third lower wiring lines 122a, 122b, and 122c extend generally parallel to each other (i.e., they do not cross).

As seen in FIG. 10, a second interlayer insulating layer 124 is provided on the first interlayer insulating layer 118 on which the lower wiring lines 122 are formed. An upper damascene wiring line 146, which is connected to ones of the lower wiring lines 122, is provided in the second interlayer insulating layer 124. The upper damascene wiring line 146, which extends across the first to third lower wiring lines 122a, 122b, and 122c, as described previously, includes a region that protrudes laterally from a portion thereof that intersects (overlies) the lower wiring lines 122. Via holes 126, which are connected to the lower wiring lines 122, are formed under the protruded region.

Opposite ends of the upper damascene wiring line 146 are shown with protruding region, and respective via holes 126 are connected to lower portion of the protruded regions, so that the first lower wiring line 122a and the third lower wiring line 122c under both ends of the upper damascene wiring line 146 are electrically connected to each other. The ends of the upper damascene wiring line 146 may protrude in a same direction or in an opposite direction to each other.

The upper damascene wiring line 146 may be a metal wiring line made of a metal material, such as copper, and a diffusion barrier film (see 142 of FIG. 17) is shown formed between the upper damascene wiring line 146 made of the metal material and the second interlayer insulating film 124 to limit or even prevent the metal material from being diffused therebetween. Additionally, a seed layer may be interposed between the diffusion barrier film (see 142 of FIG. 17) and the upper damascene wiring line 146.

As seen in the embodiments of FIG. 9, the upper damascene wiring line 146 extends generally in a straight linear pattern in the second interlayer insulating layer 124 to selectively connect the lower wiring lines 122.

Figure 12:
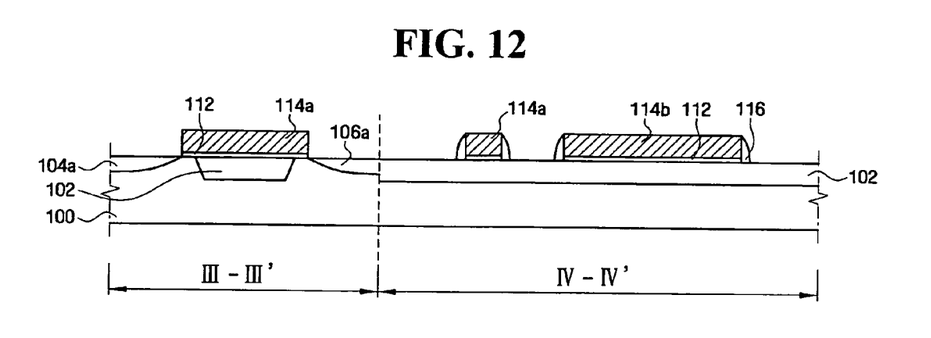

A method of fabricating (forming) a semiconductor memory device according to some embodiments of the present invention will be described by reference to FIGS. 10 to 17. As shown in FIGS. 11 and 12, first active regions and second active regions 104a, 104b, 106a, and 106b are defined by forming device isolation layer patterns 102 in the semiconductor substrate 100. For example, a trench may be formed by selectively etching the semiconductor substrate 100, and the device isolation layer patterns 102 may be formed by burying an insulating material filling the trench.

The first active regions and the second active regions 104a, 104b, 106a, and 106b may be formed by selectively ion-injecting n-type and p-type impurity materials into the semiconductor substrate 100 on which the device isolation layer patterns 102 are formed. For purposes of this exemplary description, the first active regions 104a and 104b are formed with the n-type impurity material, and the second active regions 106a and 106b are formed with the p-type impurity material. The first active regions and the second active regions 104a, 104b, 106a, and 106b are shown positioned symmetrically, and divided into two parts, respectively.

A first gate electrode to a third gate electrode 114a, 114b, and 114c are formed on the semiconductor substrate 100 including the first active regions and the second active regions 104a, 104b, 106a, and 106b. For example, a gate oxide film and a gate conductive film may be sequentially formed on the semiconductor substrate 100 in which the first active regions and the second active regions 104a, 104b, 106a, and 106b are formed. The first to third gate electrodes 114a, 114b, and 114c may be formed by a photolithography process. As shown in FIG. 11, the first gate electrode and the second gate electrode 114a and 114b may be formed so as to intersect the first active regions and the second active regions 104a, 104b, 106a, and 106b. The first gate electrode and the second gate electrode 114a and 114b may also be formed to extend on the device isolation layer patterns 102 between the first active regions and the second active regions 104a, 104b, 106a, and 106b so as to protrude laterally toward the each other. Furthermore, the third gate electrode 114c is shown formed so as to intersect (overly) the first active regions 104a and 104b, which are divided into two parts.

As seen in FIG. 12, source/drain regions are formed by ion-implanting the impurity into the first active regions and the second active regions 104a, 104b, 106a, and 106b at both sides of the first to third gate electrodes 114a, 114b, and 114c. Gate spacers 116 may be formed at side walls of the first to third gate electrodes 114a, 114b, and 114c by depositing an insulating layer on an overall surface and performing an etch back process that leaves the gate spacers 116 on the side walls.

Figure 14:
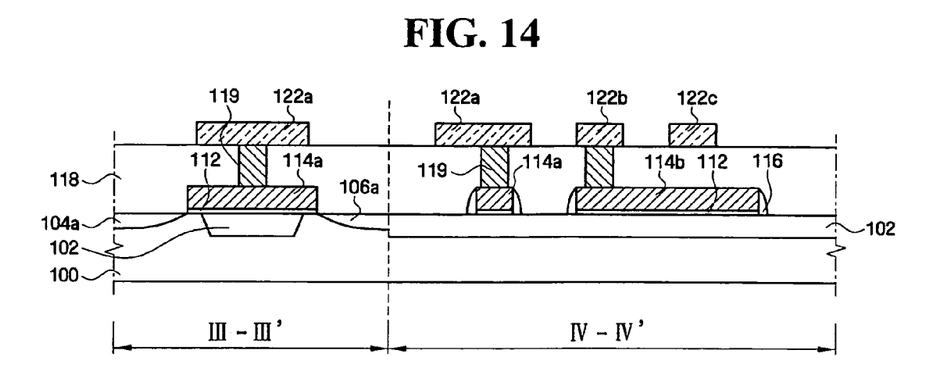

As shown in FIGS. 13 and 14, the first interlayer insulating layer 118 is formed on the surface of a resultant product. Contact holes are formed to expose the top of the first active regions and the second active regions 104a, 104b, 106a, and 106b and the first to third gate electrodes 114a, 114b, and 114c by, for example, etching a selected region of the first interlayer insulating layer 118. After depositing a conductive material so as to bury the contact holes, contacts 119 are formed in the first interlayer insulating layer 118, for example, by flattening or polishing until the first interlayer insulating layer 118 is exposed.

By depositing a metal material on the interlayer insulating layer 118 including the contacts 119 and by performing a photolithography process, the lower wiring lines 122 may be formed so as to be connected to the respective contacts 119. The illustrated lower wiring lines 122 include a first lower wiring line 122a connected to the first gate electrode 114a, a second lower wiring line 122b through which ones of the first active regions and the second active regions 104a, 104b, 106a, and 106b may be connected to the second gate electrode 114b, and a third lower wiring line 122c through which ones of the first and second active regions 104a, 104b 106a, and 106b may be connected to each other. In addition, the first to third lower wiring lines 122a, 122b, and 122c may be formed in a selected direction so as to extend substantially parallel to one another (i.e., without crossing each other).

Figure 15:
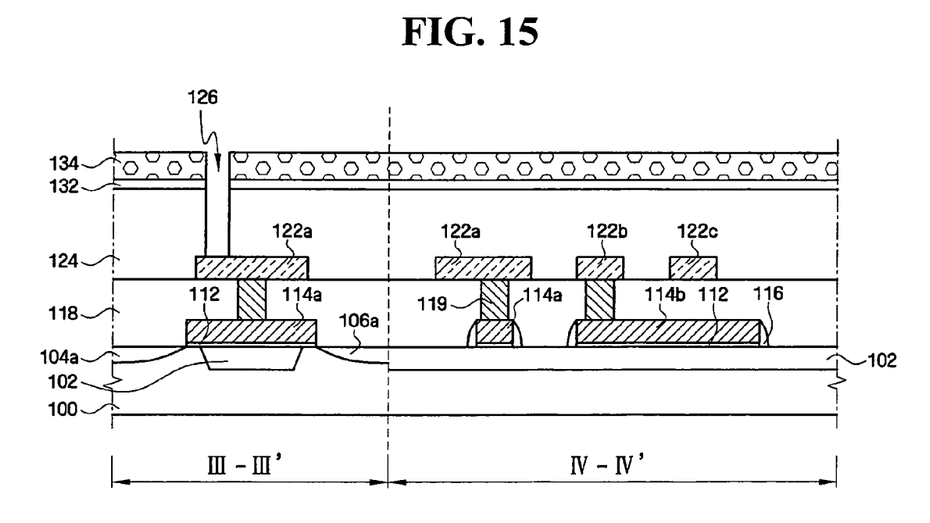

As shown in FIG. 15, a second interlayer insulating film 124 and a first antireflective film 132 may be sequentially formed on the first interlayer insulating film 118 on which the lower wiring lines 122 are formed. The second interlayer insulating film 124 may be formed of a silicon oxidation film, for example, such as PSG (PhosphoSilicate Glass), BPSG (BoroPhosphoSilicate Glass), USG (UndopedSilicate Glass), and/or PE-TEOS (Plasma Enhanced-TetraEthyOrthoSilicate) and/or a low dielectric film, which may be fluorine or carbon doped. The first antireflective film 132 may be formed of an organic material.

A first photoresist pattern 134 is shown formed on the first antireflective film 132 and patterned so as to form a via hole 126. The first lower wiring line and the third lower wiring line 122a and 122c are exposed by respective via hole(s) 126, only one of which is shown in FIG. 15. By using the first photoresist pattern 134 as an etching mask, a portion of the second interlayer insulating layer 124 and the first antireflective film 132 may be sequentially etched to form the via hole(s) 126, which expose the first lower wiring line and the third lower wiring line 122a and 122c, respectively.

Figure 16:
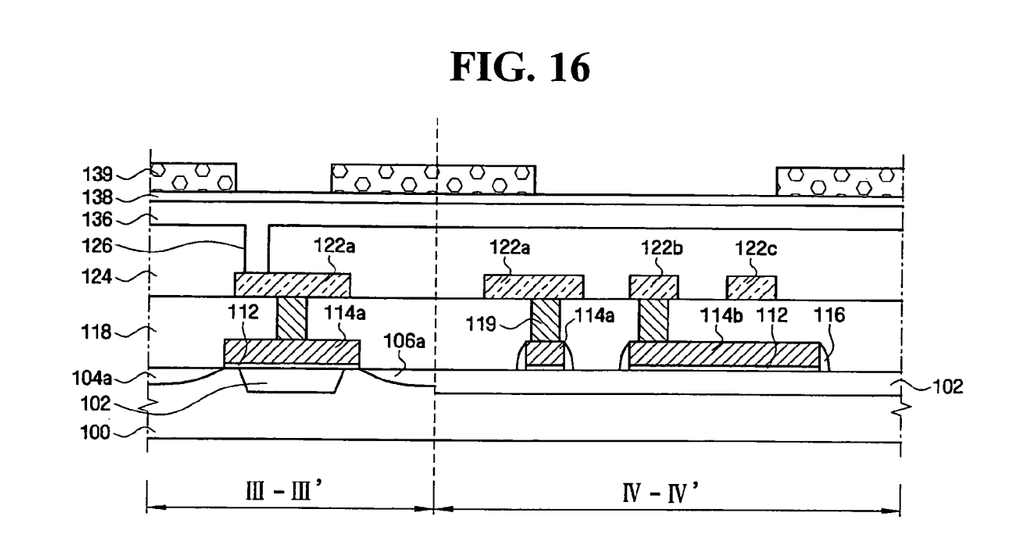

After forming the via hole 126, the first photoresist pattern 134 and the first antireflective film 132, which remain on the second interlayer insulating layer 124, are removed. Then, as shown in FIG. 16, a sacrificial film 136 is formed on the second interlayer insulating layer 124. The sacrificial film 136 as seen in FIG. 16 fills (buries) the via hole 126. The sacrificial film 136 may be dry-etched at a dry etching rate which is similar to that of the second interlayer insulating layer 124, and may be formed of a SOD (Spin On Deposition) film having a high wet etching selectivity with respect to the low dielectric interlayer insulating layers. As the SOD film typically has an excellent via hole burying characteristic and flattening characteristic, the SOD film is generally used as a burying material or a flattening (planarization) material. For example, a HSQ (Hydrogen Silses Quioxane) film, a MSQ (Methyl Silses Quioxane) film and/or a SOP (Spin On Polymer) film may be used as the SOD film.

After forming the sacrificial film 136, a second antireflective film 138, which may be an organic material, is formed on the sacrificial film 136. A second photoresist pattern 139 is formed on the second antireflective film 138 and patterned so as to form the trench 128. As such, by using the second photoresist pattern 139 as an etching mask, a portion of the second antireflective film 138, the sacrificial film 136, and the second interlayer insulating layer 124 may be sequentially etched. The sacrificial film 136 and the second interlayer insulating layer 124 may be etched regardless of the etching selectivity. Using the above described processes, the trench 128 may be formed in the second interlayer insulating layer 124. The trench 128 is connected to the via hole 126.

Figure 17:
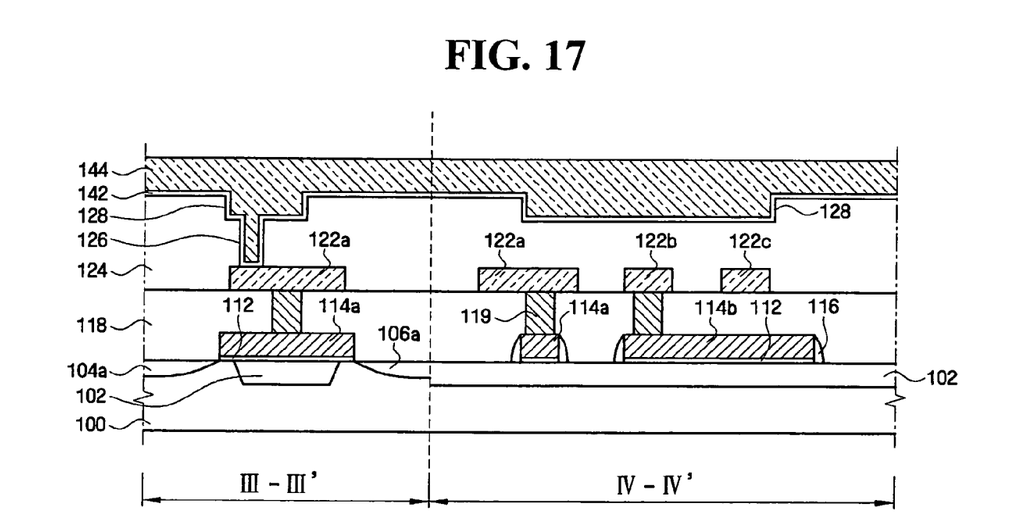

The trench 128 formed extending over and across the first to third lower wiring lines 122a, 122b, and 122c is formed in the second interlayer insulating layer 124 in a second direction different from and extending across the first direction in which the first to third lower wiring lines 122a, 122b, and 122c extend. The second interlayer insulating layer 124 as shown in FIG. 17 does not overlap with the via hole 126 which is formed at the lower portion thereof. The trench 128 includes an extension region that protrudes from the region which intersects (overlies) the first lower wiring line and the third lower wiring line 122a and 122c, and the via hole(s) 126 are formed therein. That is, the trench 128 is formed so that the both ends of the trench 128 protrude in the same direction or in an opposite direction to each other to correspond with the position of the via hole(s) 126. In addition, the trench 128 is connected to the via hole 126 in the protruded region. That is, the via hole 126 connected to the first lower wiring line 122a and the third lower wiring line 122c is connected to the trench 128. In addition, the width of the trench 128 of the protruded region connected to the via hole 126 may be similar to that of the lower via hole 126. Accordingly, during the etching process of forming the trench 128, the phenomenon in which a corner of the via hole 126 formed at the lower portion collapses in the direction of the second lower wiring line 122b positioned at one side may be limited or even prevented.

As seen in FIG. 17, after forming the trench 128 as described above, the second photoresist pattern 139 and the second antireflective film 138 are removed. The sacrificial film 136 remaining in the upper portion of the second interlayer insulating layer 124 and within the via hole 126 is removed. Using the method described herein, the illustrated trench 128 may be formed in the second interlayer insulating layer 124.

As shown in FIG. 17, a diffusion barrier film 142 and a seed layer (not shown) may be deposited conformally along the trench 128 and the via hole 126. The diffusion barrier film 142 may be formed of, for example, of a material selected from Ta, TaN, TaSiN, Ti, TiN, TiSiN, W, and WN, or a combination thereof. The seed layer may be a copper film, which may be deposited by a CVD process and/or a PVD process.

A conductive film 144 is formed in the trench 128 and the via hole 126, on which the diffusion barrier film 142 and the seed layer are formed, for example, by performing an electro plating and/or an electroless plating. The conductive film 144 may have a thickness sufficient to fill (bury) the trench 128 and the via hole 126. The conductive film 144 may be formed of various conductive materials and combination thereof. In some embodiments, the conductive film 144 includes copper (Cu).

Referring now to FIG. 10, an upper damascene wiring line 146 is shown, which may be formed by performing the CMP process until the second interlayer insulating layer 124 is exposed. The upper damascene wiring line 146 is shown formed so as to selectively connect the other lower wiring lines 122. As also seen in FIG. 9, additional wiring lines may be formed while forming the upper damascene wiring line 146, which other wiring lines may selectively connect lower wiring lines 122 other than the lower wiring lines 122a, 122b, 122c, which additional wiring lines may be formed in a straight line without a protruding portion as seen in FIG. 9.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

As described above, according to some embodiments of the present invention, a semiconductor memory device includes an upper damascene wiring line having protruded regions protruded laterally above the lower wiring lines formed in the interlayer insulating layer so as to be vertical (extend across) to the lower wiring lines, and that is provided with a via connected to the lower wiring lines at the lower portion of the protruded regions. Accordingly, during the forming of the trench which is connected to the via hole, it may limit or even prevent the phenomenon by which the corner of the via hole collapses toward the lower wiring line positioned at one side.

Furthermore, it may limit or even prevent the short of the upper wiring line and the lower wiring line, which may be generated by the exposure of the one-side lower wiring line due to the collapse of the corner of the via hole. As a result, it may be possible to improve the electrical characteristic of the semiconductor memory device. In addition, by forming the upper damascene wiring line as above-described, it may be possible to obtain an improved process margin.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit memory device comprising:

an integrated circuit substrate;

a plurality of lower wiring lines on the substrate and extending in a first direction;

a first interlayer insulating layer on the plurality of lower wiring lines;

an upper damascene wiring line in an upper portion of the interlayer insulating layer and extending to an upper surface of the interlayer insulating layer and extending in a second direction, different from the first direction, to extend over the plurality of lower wiring lines, the upper damascene wiring line having a main region and protruded regions extending therefrom in a direction different from the second direction, the protruded regions extending over respective underlying ones of the lower wiring lines;

a first via extending through the first interlayer insulating layer under a first of the protruded regions and connecting the upper damascene wiring line to a corresponding underlying first one of the plurality of lower wiring lines;

a second via extending through the first interlayer insulating layer under a second of the protruded regions and connecting the upper damascene wiring line to a corresponding underlying second one of the plurality of lower wiring lines;

a first active region in the integrated circuit substrate;

a second active region in the integrated circuit substrate, the second active region having a type different from a type of the first active region;

a gate electrode on the integrated circuit substrate that intersects the first active region and the second active region;

a second interlayer insulating layer on the substrate in a region including the gate electrode and extending over the gate electrode, wherein the plurality of lower wiring lines and the first insulating layer are on the second insulating layer; and a via extending through the second interlayer insulating layer that connects the first one of the plurality of lower wiring lines to the gate electrode, wherein the first via extending through the first interlayer insulating layer is displaced further from the main region of the upper damascene wiring line than the via extending through the second interlayer insulating layer.

2. The integrated circuit memory device of claim 1, wherein the first and second protruded regions each extend in a same direction.

3. The integrated circuit memory device of claim 1, wherein the first and second protruded regions extend in opposite directions to each other.

4. The integrated circuit memory device of claim 1, wherein the first active region comprises a plurality of first active regions, the second active region comprises a plurality of second active regions, the gate electrode comprises a first gate electrode on the integrated circuit substrate that intersects a first one of the first active regions and a first one of the second active regions and the via extending through the second interlayer insulating layer comprises a first via that connects the first one of the plurality of lower wiring lines to the first gate electrode and wherein the device further comprises:

a second gate electrode on the integrated circuit substrate that intersects a second one of the first active regions and a second one of the second active regions; and a second via extending through the second interlayer insulating layer that connects another one of the plurality of lower wiring lines to the second gate electrode, wherein the second interlayer insulating layer extends over the first and second gate electrodes and wherein the second via extending through the first interlayer insulating layer is displaced further from the main region of the upper damascene wiring line than the second via extending through the second interlayer insulating layer.

5. The integrated circuit memory device of claim 4, wherein the another one of the plurality of lower wiring lines is a third one of the plurality of wiring lines, different from the second one of the plurality of wiring lines.

6. The integrated circuit memory device of claim 5, wherein the second one of the plurality of lower wiring line connects ones of the first active regions and the second active regions to each other.

7. The integrated circuit memory device of claim 6, wherein the first, second and third ones of the plurality of lower wiring lines extend substantially parallel to one another.

8. The integrated circuit memory device of claim 4, wherein the first active regions and the second active regions are divided into two parts, respectively.

9. The integrated circuit memory device of claim 4, further comprising a third gate electrode that intersects the first and second ones of the first active regions.

10. The integrated circuit device of claim 4, wherein the device comprises a CMOS memory device and wherein the type of the first active regions comprises one of n-type or p-type and the type of the second active regions comprises the other of n-type or p-type.

11. The integrated circuit memory device of claim 1, further comprising a barrier film between the interlayer insulating layer and the upper damascene wiring line.

12. The integrated circuit memory device of claim 11, wherein the barrier film further extends between the interlayer insulating layer and the first and second vias.

* * * * *